(12) United States Patent
Abe et al.

(10) Patent No.: US 6,504,615 B1
(45) Date of Patent: *Jan. 7, 2003

(54) OPTICAL INSTRUMENT FOR MEASURING SHAPE OF WAFER

(75) Inventors: Kohzo Abe, Annaka (JP); Nobuaki Iguchi, Kawasaki (JP)

(73) Assignees: Super Silicon Crystal Research Institute Corporation (JP); Kuroda Precision Industries, Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/423,483

(22) PCT Filed: Feb. 5, 1999

(86) PCT No.: PCT/JP99/00492

§ 371 (c)(1),
(2), (4) Date: Nov. 8, 1999

(87) PCT Pub. No.: WO99/46814

PCT Pub. Date: Sep. 16, 1999

(30) Foreign Application Priority Data

Mar. 9, 1998 (JP) ............................................. 10-056487

(51) Int. Cl.[7] ................................................. G01B 9/02
(52) U.S. Cl. ......................................................... 356/511
(58) Field of Search .............................. 356/514, 511, 356/503, 450, 496, 512, 513

(56) References Cited

U.S. PATENT DOCUMENTS 4,860,229 A    8/1989   Abbe et al. ................. 364/563
5,995,226 A  * 11/1999   Abe et al. .................... 356/511

FOREIGN PATENT DOCUMENTS

| JP | 61175513  | 8/1986  |
| JP | 61292508  | 12/1986 |
| JP | 01143906  | 6/1989  |
| JP | 5-77179   | 10/1993 |
| JP | 10056487  | 3/1998  |
| JP | 11-02512  | 1/1999  |

* cited by examiner

Primary Examiner—Frank G. Font
Assistant Examiner—Andrew H. Lee
(74) Attorney, Agent, or Firm—Webb Ziesenheim Logsdon Orkin & Hanson, P.C.

(57) ABSTRACT

A pair of optical profile measuring systems 10, 20 are located at positions facing to both surfaces of a wafer 1 vertically supported at its edge. A thickness gauge 50 having one or more sensors is located between the optical systems 10, 20 for measuring thickness at several points on the wafer 1. Each optical system 10, 20 comprises a light emitter 11, 21 for discharging a measuring light beam 12, 22, a collimator lens 14, 24 for rectifying the light beam 12, 22 into a collimated beam, an optical flat 15, 25 for transmitting the collimated light beam 12, 22, a light detector 16, 26 receiving the light beams 12, 22 reflected on a surface of the wafer 1 and on a referential plane of the optical flat 15, 25 through the collimator lens 14, 24 and a computer 17, 27 for processing interference fringes which occur between the surface of the wafer 1 and the referential plane of the optical flat 15, 25. Profiles of main and backside surfaces of the wafer 1 are calculated from interference fringes corresponding to both surfaces of a wafer 1, and a real shape of the wafer 1 is determined from the profiles in consultation with thickness values measured by the thickness gauge 50.

2 Claims, 5 Drawing Sheets

OPTICAL INSTRUMENT FOR MEASURING SHAPE OF WAFER

BACKGROUND OF THE INVENTION

1. Field of the Invention

The present invention relates to an optical apparatus which enables high-speed measurement of a real shape of a wafer for detection of a flatness, a thickness and profiles of both surfaces.

2. Brief Description of the Prior Art

A flatness or thickness variation of a wafer has been measured so far by either an optical method using interference fringes or a physical method using displacement sensors which scan both surfaces of the wafer.

In the conventional optical method, a thickness variation is calculated from interference fringes, which occur between a referential plane of an optical lens and a surface of a wafer. The method enables high-speed measurement, but uses necessarily a vacuum chuck for attracting a backside surface of the wafer. When the wafer is attracted to a vacuum chuck inferior of flatness, the wafer itself is often deformed. The inferior flatness of the vacuum chuck is likely incorporated as an error in measurement results, so that the thickness variation of the wafer can not be detected with high reliability. There is also such the defect that chucking flaws are likely formed on the backside, since the wafer is held in direct contact with the vacuum chuck.

Use of interference fringes derived from light beams reflected on both surfaces of a wafer for detection of a thickness variation is disclosed in JP A 1-143906. In this method, light beams emitted from a light source are split to transmitting and reflecting beams by a beam splitter, reflected on both surfaces of a wafer and then inputted to light detectors. Optical interference fringes occur in correspondence with a difference in an optical path between the transmitting and reflecting beams.

On the other hand, in the physical method using displacement sensors, a deviation in a thickness of a wafer is calculated on the basis of positional signals detected by capacitance-type displacement sensors provided at both surfaces of the wafer, and a thickness variation of the wafer is calculated regarding its backside surface as an ideal flat plane. For instance, JP B 5-77179 discloses provision of displacement sensors at positions facing to both surfaces of a wafer, so as to produce deviation signals from every part of the wafer by rotation of the wafer.

The physical method using displacement sensors has been commonly used so far for detecting a thickness variation of a wafer, since measurement is performed with high reproductivity without any defects caused by a vacuum chuck. However, the wafer is necessarily rotated for scanning due to a small probe of the displacement sensor, so that it takes a longtime to scan a whole surface of the wafer.

When a surface part of the wafer attracted to a vacuum chuck is to be scanned, the wafer is re-held, and then motion of the sensors is changed to a swinging mode for scanning the remaining surface part which was attracted with the vacuum chuck, as disclosed in JP B 5-77179. The re-holding prolongs a measuring time in total and needs troublesome works.

Since the wafer is being rotated during measuring, both surfaces of the wafer come in contact with a large quantity of the air. Such contact means exposure of the wafer to adhesion of particles suspended in the air. Particles are also transferred from the vacuum chuck to the backside of the wafer. Adhesion of particles often unfavorably affects on measurement results.

When a wafer is scanned with displacement sensors, a circumferential part of the wafer is not subjected to scanning in order to avoid incorporation of edge effects into detected signals. In this regard, the circumferential part of the wafer has been regarded as an unmeasurable zone, resulting in reduction of a surface zone applicable for measurement of a thickness variation.

A wafer for measurement is horizontally held by attracting its backside center to a vacuum chuck. Due to this holding means, measurement results are likely affected by gravity as enlargement of the wafer in size. Deformation of the wafer at its periphery is often incorporated as an error into measurement results.

Defects caused by holding a wafer with a vacuum chuck is eliminated in an optical method of measuring a thickness variation of a wafer held in such a state kept free from a holding force, as disclosed in JP A 1-143906. According to this method, measurement is performed with ease in a short time, since a thickness variation is calculated from interference fringes, which occur between transmitting and reflecting light beams reflected on both surfaces of the wafer. Although the thickness variation is merely judged from the interference fringes, undulation or inclination of the wafer which is not accompanied with a thickness variation can not be detected. In addition, affections of particles floating in the air, positioning of a wafer, assembling accuracy of various members to a measuring apparatus, etc. are likely incorporated as errors into measurement results due to a long light path necessarily designed for occurrence of interference fringes.

In order to solve the above problems, the inventors proposed an optical apparatus for detecting profiles of a wafer from two sets of interference fringes, which occurred between optical flat lenses and S both surfaces of a wafer, as proposed in JP A 11-2512. In this apparatus, a pair of optical measuring systems are located at positions facing to both surfaces of a wafer which is vertically supported. The apparatus enables high-speed and accurate measurement of a thickness variation as well as profiles of both surfaces of a wafer without either adhesion of particles or formation of flaws.

Pair of flat lenses, which respectively face to main and backside surfaces of a wafer, must be located in a condition perfectly parallel each other, in order to produce interference fringes which accurately represent profiles of both surfaces of the wafer. However, the parallelism tends to be affected by fluctuation of room temperature, deformation of the lens supporting members in the laps of time, etc.

Poor parallelism is unfavorably incorporated as an error into calculation of a thickness variation, resulting in lack of reliabilities in measured data. If affection of the poor parallelism is eliminated, the optical measuring apparatus can be used for measuring a thickness variation and profiles of the both surfaces of a wafer with high accuracy and reliability.

SUMMARY OF THE INVENTION

The present invention is an improvement in the optical apparatus proposed in the former patent application (JP A 11-2512) for high-speed and precise measurement of wafers.

The object of the present invention is to enable high-speed and precise measurement of a real shape of a wafer including a thickness variation and profiles of both surfaces. The object is accomplished by calculation of profile data representing both surfaces of the wafer obtained by an optical measuring apparatus in consultation with thickness values actually detected by displacement sensor provided at several points of the wafer. The newly proposed method effectively deletes errors derived from poor parallelism between light paths of two optical measuring systems, due to consultation with actually detected thickness values.

The newly proposed optical profile measuring apparatus comprises a pair of optical measuring systems located at positions facing to both surfaces of a wafer vertically supported at its edge and a thickness thickness-measuring sensors located at a position or positions facing to a circumferential part of both surfaces of the wafer.

Each optical measuring system has a light source for emitting a measuring light beam, a collimator lens for rectifying the measuring light beam into a collimated beam, an optical flat for transmitting the collimated measuring beam therethrough, a light detector for receiving the measuring beams which have been reflected on a surface of said wafer and on a referential plane of said optical flat and then returned through the collimator lens, and a computer for processing interference fringes which occur between the two light beams reflected on the referential plane of the optical flat and the surface of the wafer. Profiles of both surfaces of the wafer are calculated from the interference fringes corresponding to both surfaces of the wafer, and a real shape of the wafer is grasped from the profiles in consultation with thickness values actually measured at a plurality of points of the wafer by the thickness gauge.

Triangular prisms may be used instead of optical flats. In this case, interference fringes corresponding to both surfaces of the wafer occur between referential planes of the triangular prisms and both surfaces of the wafer.

DETAILED DESCRIPTION OF THE PREFERRED EMBODIMENT

The features of the present invention will become apparent from the following explanation, consulting with the drawings attached.

Figure 1:
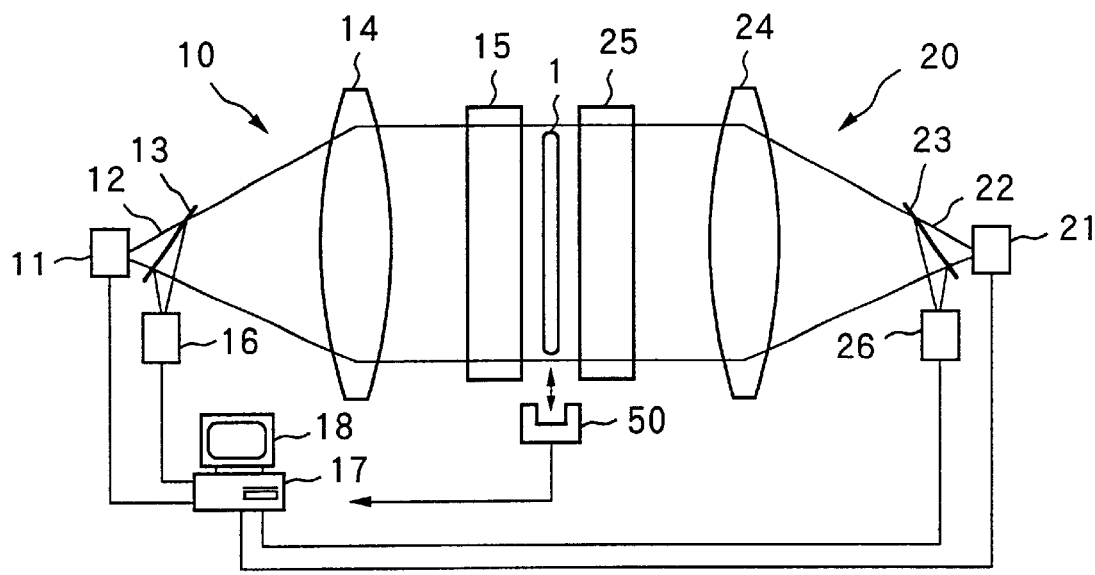
FIG. 1 is a schematic view illustrating a newly proposed profile measuring apparatus using optical flats together with a thickness gauge.

In the newly proposed optical profile measuring apparatus, a wafer 1 for measurement of profiles is vertically supported at its edge by proper means, as shown in FIG. 1. Due to the vertical supporting, the wafer 1 is kept in a state released from restrictions by holding means such as a vacuum chuck. The vertical supporting of the wafer 1 at its edge is also effective for measuring substantially a whole surface of the wafer 1, since there is no unmeasurable surface part covered with supporting means.

Optical measuring systems 10, 20 are located at both sides of the wafer 1. A light emitter 11, 21 in each optical measuring system 10, 20 discharges a measuring light beam 12, 22. Each light beam 12, 22 from the light emitter 11, 21 is transmitted through a half mirror 13, 23 to a collimator lens 14, 24 and then as a collimated beam through an optical flat 15, 25 to project each surface of the wafer 1. Some of the light beam 12, 22 is reflected on the surface of the wafer 1, while the rest of the light beam 12, 22 is reflected on a referential plane of the optical flat 15, 25 facing to a main or backside surface of the wafer 1.

The measuring light beam 12, 22 reflected on the surface of the wafer 1 together with the light beam 12, 22 reflected on the referential plane of the optical flat 15, 25 returns through the optical flat 15, 25 and the collimator lens 14, 24 along the reverse path, reflected on the half mirror 13, 23 and then inputted to each light detector 16, 26.

The light paths of the light beams 12, 22 reflected on both surfaces of the wafer are different from the light paths of the light beams 12, 22 reflected on the referential planes of the optical flats 15, 25. Since the light path difference corresponds to a surface condition the wafer 1 at each side, interference fringes representing profiles of main and backside surfaces of the wafer 1 occur between the light beams reflected on surfaces of the wafer 1 and the light beams reflected on the referential planes of the optical flats 15, 25. Consequently, profiles of main and backside surfaces of the wafer 1 are calculated from the interference fringes.

The light emitters 11, 21 and the light detectors 16, 26 are led to computers 17, 27 equipped with monitors 18, 28. Both the interference fringes which have occurred between the referential planes of the optical lenses 15, 25 and both surfaces of the wafer 1 are simultaneously inputted to the computers 17, 27. Profiles of the main and backside surfaces of the wafer 1 are calculated from inputted data of the interference fringes and recorded in the computers 17, 27. A thickness variation of the wafer 1 is also calculated from the profile of the main surface regarding the backside surface as an ideal flat plane and recorded in the computers 17, 27.

Figure 3:
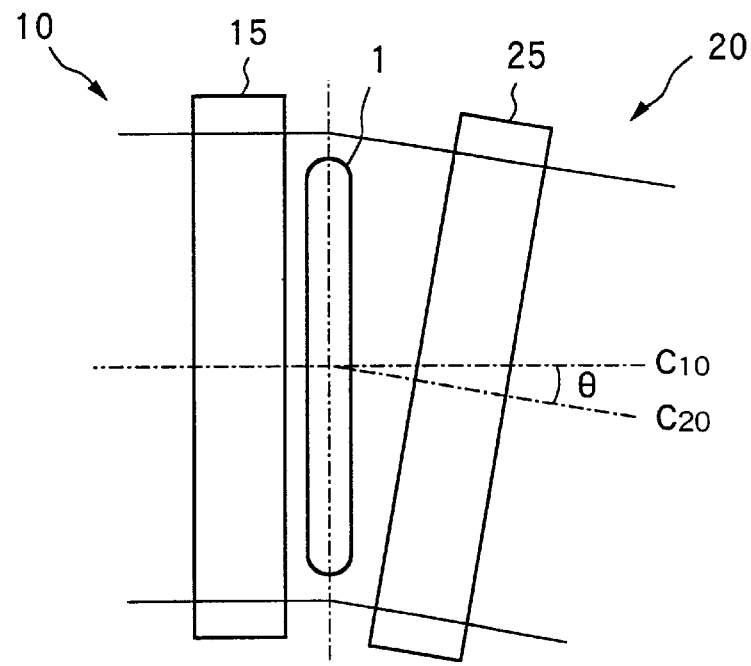
FIG. 3 is a view for explaining an error caused by poor parallelism between two optical profile measuring systems.

The optical flats 15, 25 or the optical measuring systems 10, 20 are often positioned with poor parallelism. Poor parallelism makes it difficult to detect a real shape of the wafer 1. For instance, if axes C10, C20 of the optical measuring systems 10 and 20 are deviated from each other with a little tilt angle θ as shown in FIG. 3, inclination corresponding to the angle θ is incorporated as an error into measuring data for calculation of a thickness variation of the wafer 1.

According to the present invention, such an error caused by poor parallelism is deleted from the measuring data by consultation with thickness values of the wafer 1 actually measured by a thickness gauge 50 having one or more displacement sensors. Due to deletion of such an error, calculation results are superior of accuracy with high reliability, the measuring apparatus is easily set up, and measurement itself is performed with ease.

Figure 4:
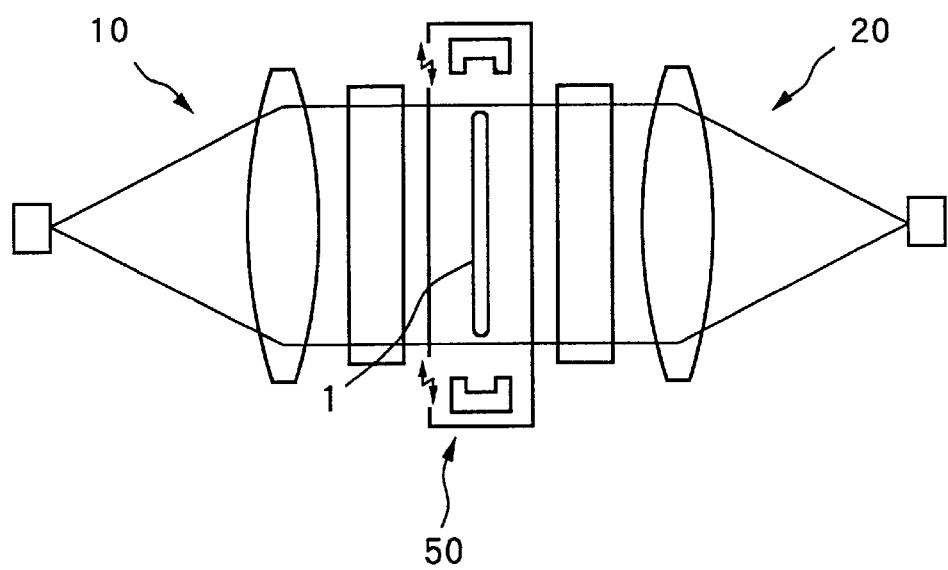
FIG. 4 is a view illustrating a profile measuring apparatus having a thickness gauge installed therein.
Figure 5:
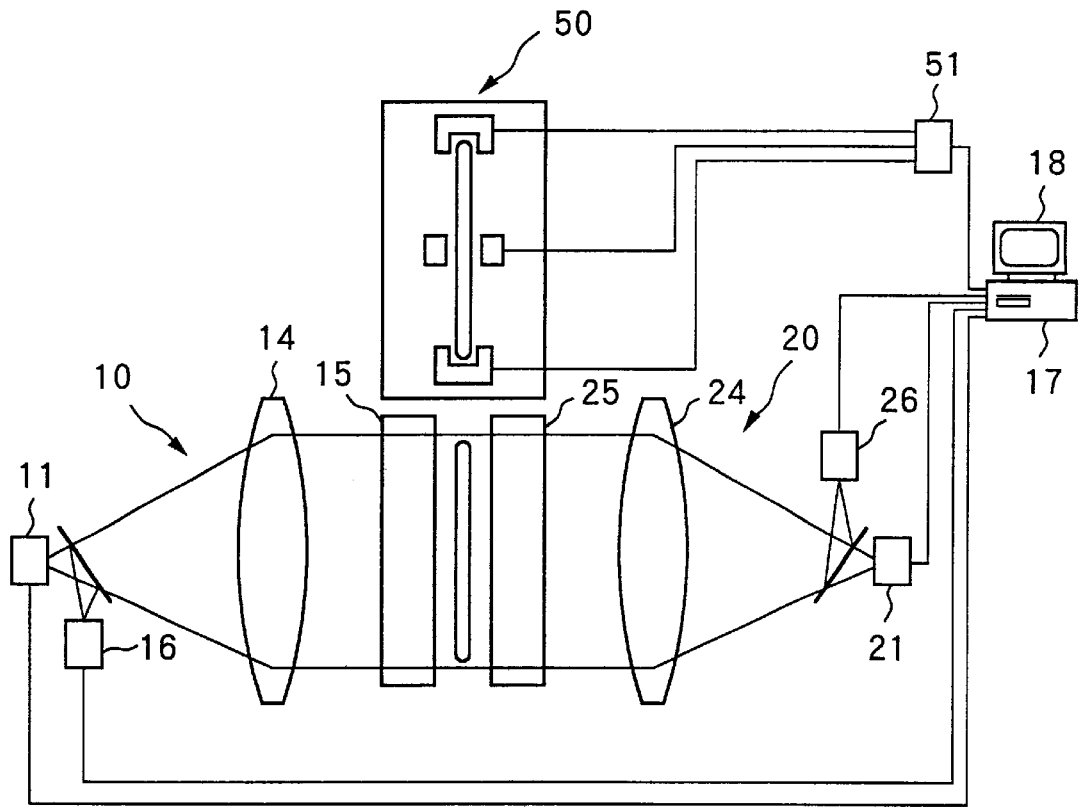
FIG. 5 is a schematic view illustrating a profile measuring apparatus together with an independent thickness gauge.

A thickness gauge 50 may be located between the optical measuring system 10 and 20 as shown in FIG. 4, if the thickness gauge 50 is small enough. The thickness gauge 50 preferably has a structure capable of movement toward an edge of the wafer 1. The thickness gauge 50 may be also located independently from the optical measuring systems 10, 20, as shown in FIG. 5.

Figure 6:
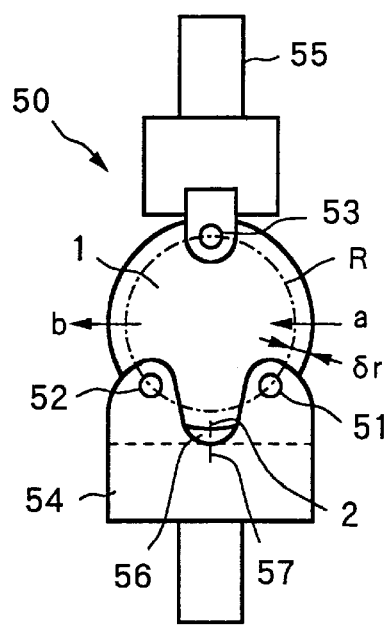
FIG. 6 is a view for explaining structure of a thickness gauge having three thickness-measuring sensors.

Thickness values of the wafer 1 measured by the thickness gauge 50 are inputted into the computer 17 and merged with interference data from the optical measuring system 10, 20 to determine a real shape of the wafer 1. The thickness values of the wafer 1 are preferably simultaneously detected at predetermined three points by the thickness gauge 50, which has three pairs of displacement sensors 51, 52, 53 located in the same intervals along a circumferential direction of the wafer 1 at a position facing to the main and backside surfaces of the wafer 1, as shown in FIG. 6. Each pair of sensors 51, 52, 53 may be a non-contacting one such as a capacitance-type or a laser-type. Use of three pairs of displacement sensors enables simultaneous detection of thickness values at three points of the wafer 1 apart from each other without necessity of rotation of the wafer 1. Of course, one or two pairs of displacement sensors may be used. In this case, the wafer 1 is relatively rotated with respect to the thickness gauge 50 for production of thickness values at at least three points of the wafer 1.

Each sensor 51, 52, 53 is located in the same intervals along the measuring circle R, whose radius is smaller by 5r than a radius of the wafer 1, at a position facing to each of main and backside surfaces of the wafer 1 near its periphery. In FIG. 6, the sensors 51, 52 are attached to the tops of a Y-shaped support .54, while the other sensor 53 is attached to another I-shaped support 55 opposed to the support 54. The support 55 is capable of vertical motion along a bisector line of the sensors 51, 52. A distance between the sensors 51, 52 and the sensor 53 is adjusted to a value corresponding to the diameter of the wafer 1, in order to locate the wafer 1 concentrically with the measuring circle R. A space between the tops of the Y-shaped support 54 serves as a peeping window 56 for adjusting a circumferential location of the wafer 1. A reference mark 57 is engraved on the edge of the peeping window 56 at a middle position between the sensors 51 and 52.

A sample wafer 1 is carried in a thickness-measuring zone along a direction a by a loader (not shown). The wafer 1 is rotated in the thickness-measuring zone, so as to adjust an orientation mark 2 of the wafer 1 to a position corresponding to the reference mark 57. Due to the adjustment, the sensors 51, 52, 53 faces to main and backside surfaces of the wafer 1 at three points in the same intervals along the measuring circle R. Thickness data obtained from the sensors 51, 52, 53 located in this way are operated as actually measured thickness values of the wafer 1 at the three points on the measuring circle R each apart from the orientation mark 2 with a preset angle. After the thickness values are obtained, the wafer 1 is carried out of the thickness-measuring zone along a direction b by an unloader (not shown).

Figure 7:
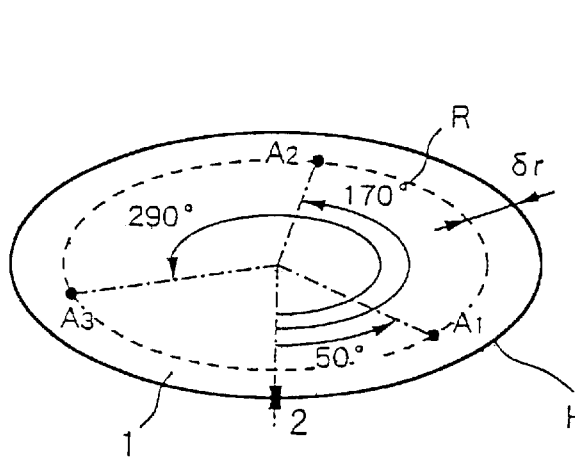
FIG. 7 is a view illustrating a model for explaining the relationship between thickness measuring points and a profile of a backside surface of a wafer.
Figure 7:
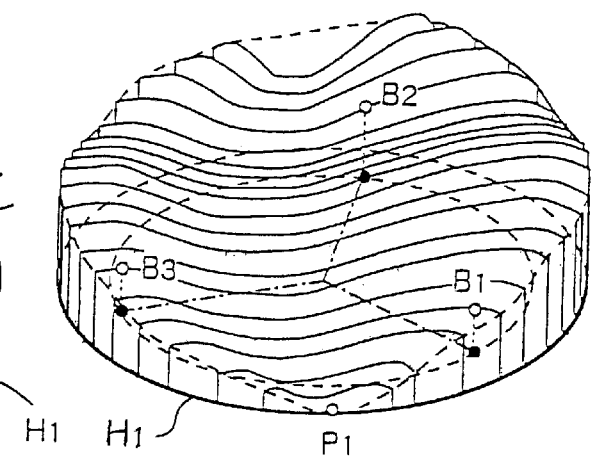

The thickness measurement at the three points using the sensors 51, 52, 53 may be performed either before or after profile measurement of the wafer 1 using the optical measuring systems 10, 20. However, it is preferable not to put so much delay between the two-way measurements for inhibition of thermal expansion errors caused by a temperature change. The thickness values measured by the sensors 51, 52, 53 are inputted into the computer 17, 27. The computer 17, 27 calculates a real shape of the wafer 1 from the thickness values and profile data as follows. In the following explanation, a side of the wafer 1 facing to the optical measuring system 20 is called as "the main surface", while the other side is called "the backside surface". Presume that three points $A_1, A_2, A_3$ on the measuring circle R apart from the orientation mark 2 with angles of 50, 170, 290 degrees, respectively, are regarded as thickness-measuring points, in order to avoid overlap of the drawing lines, as shown in FIG. 7.

At first, a reference plane $H_0$ (not shown) is determined on the basis of a profile of the backside surface obtained by the optical measuring system 10. The reference plane $H_0$ is a regression plane calculated from profile data of the backside surface of the wafer 1 by the so-called method of least squares. A point $P_1$ on the backside surface of the wafer 1 nearest the optical flat 15 is then specified, and a plane $H_1$, which includes the point $P_1$, in parallel to the reference plane $H_0$ is specified. Three thickness-measuring points $A_1, A_2, A_3$ are defined on the plane $H_1$, consulting with the orientation mark 2, as shown in FIG. 7 left. A profile of the backside surface of the wafer 1 from the optical measuring system 10 is projected on the plane Hi accounting thickness-measuring points $A_1, A_2, A_3$ as reference points, to calculate projected points $B_1, B_2, B_3$, as shown in FIG. 7 right.

Figure 8:
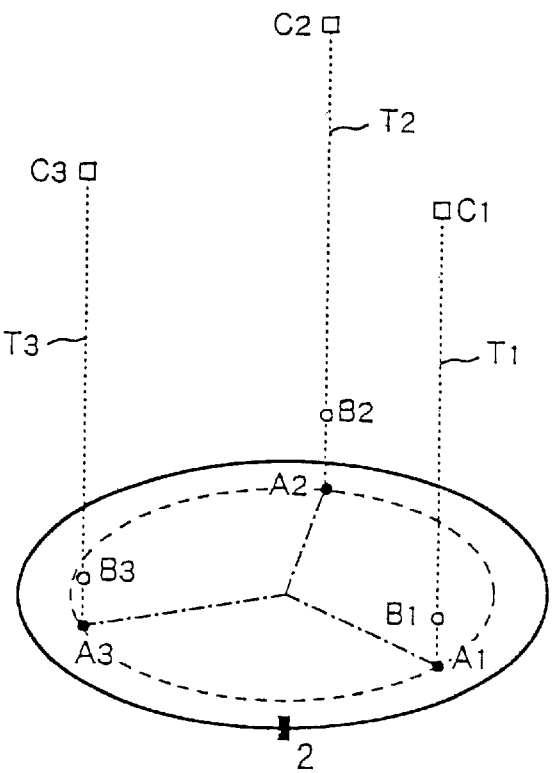
FIG. 8 is a view for explaining calculation of a profile of a main surface of a wafer in consultation with actually detected thickness values.

Thickness data $T_1, T_2, T_3$ obtained by the sensors 51, 52, 53 are added to the points $B_1, B_2, B_3$, respectively, to calculate points $C_1, C_2, C_3$ which represents heights of the wafer 1 at the thickness-measuring points $A_1, A_2, A_3$, respectively, as shown in FIG. 8. The calculated points $C_1, C_2, C_3$ are to be on the main surface of the wafer 1.

Figure 9:
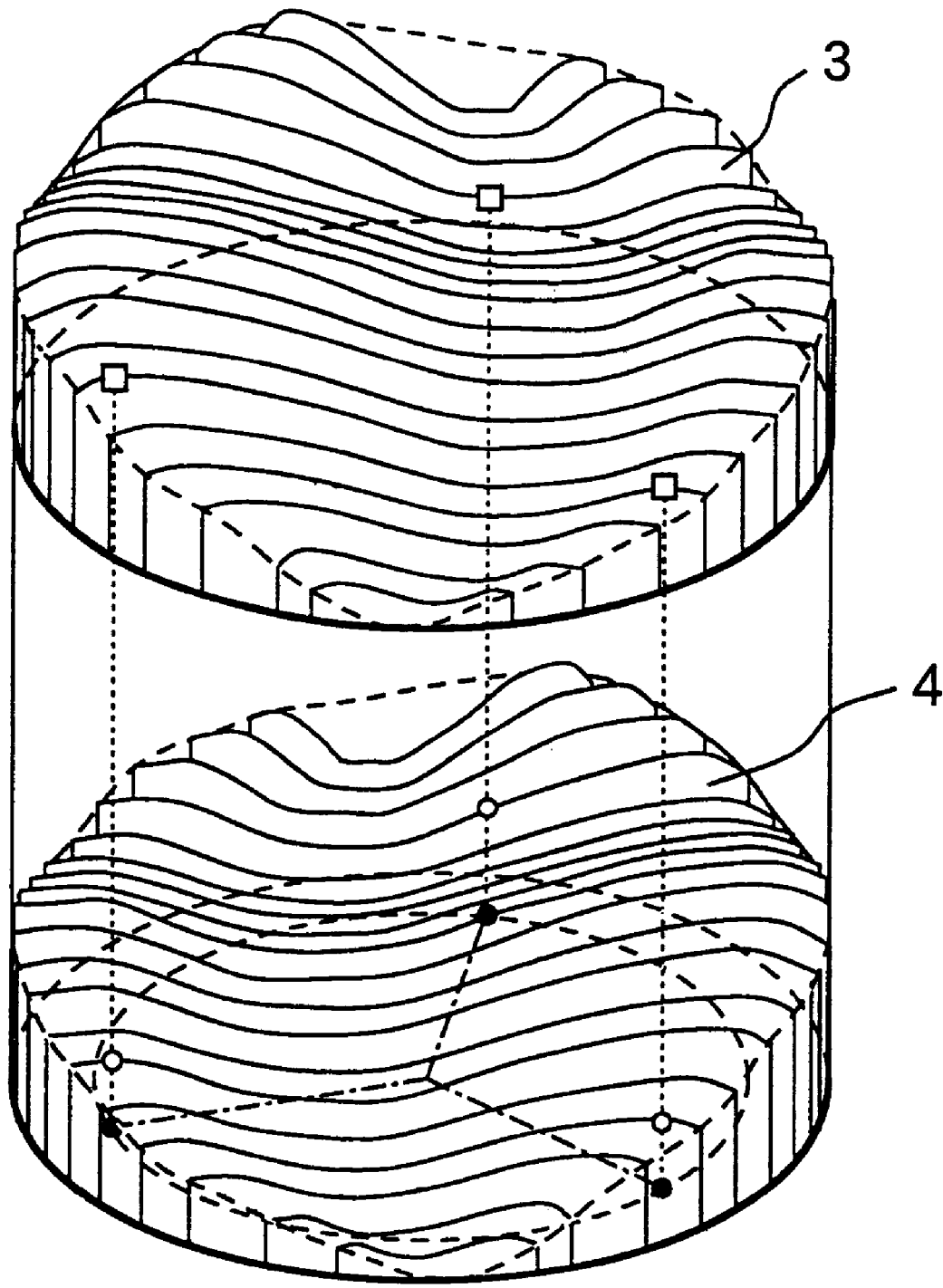
FIG. 9 is a perspective view illustrating a real shape of a wafer obtained by calculation according to the present invention.

The calculated points $C_1, C_2, C_3$ are used for determination of positional relationship of the main surface of the wafer 1 with the backside surface. Since the profiles of the main and backside surfaces of the wafer 1 are produced by the optical measuring systems 20, 10, respectively, a real shape of the wafer 1 is obtained as shown in FIG. 9 by adjusting the profile of the main surface so as to make positional data of the profile of the main surface at the thickness-measuring points $A_1, A_2, A_3$ consistent with the calculated points $C_1, C_2, C_3$, respectively.

When the profile data of the main and backside surfaces of the wafer 1 from the optical measuring systems 20, 10 are synthesized in consultation with thickness values actually measured by the sensors 51, 52, 53, the shapes of the main and backside surfaces of the wafer 1 are independently determined accounting the actually measured thickness values. A real shape of the wafer 1 is defined by such the shapes of the main and backside surfaces of the wafer 1. Even if there is a little tilt θ between the optical measuring systems 10, 20, an error caused by poor parallelism is deleted by the profile data processing in consultation with the actually measured thickness values. A thickness variation of the wafer 1 is of course calculated as a distance from the backside surface to the main surface of the real shape.

Figure 2:
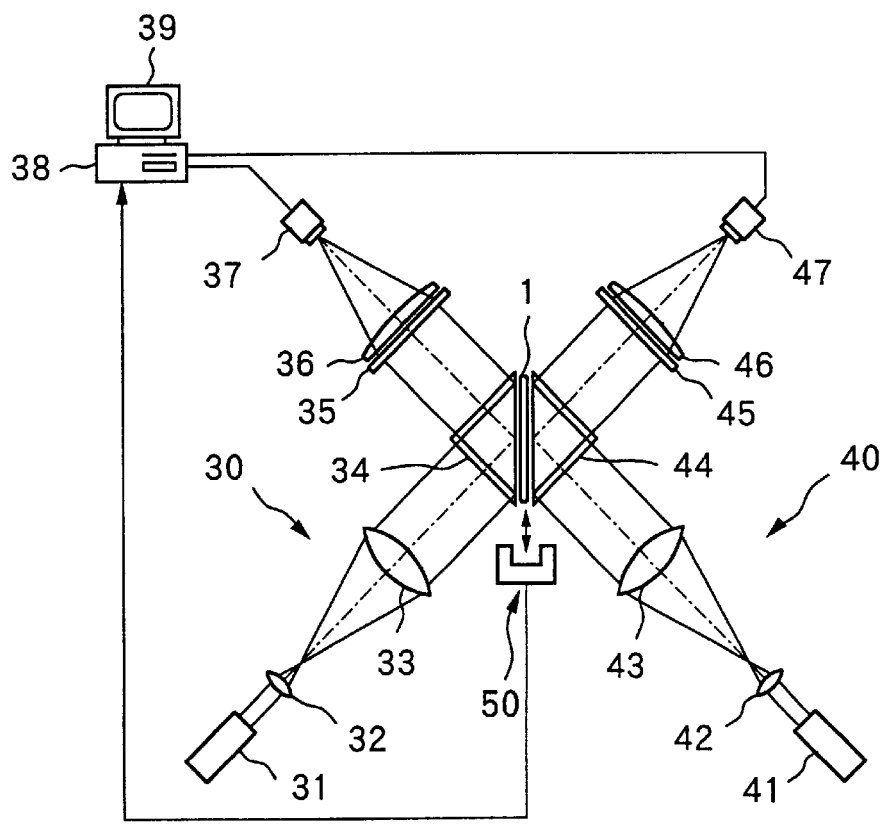
FIG. 2 is a schematic view illustrating another newly proposed profile measuring apparatus using triangular prisms together with a thickness gauge.

An oblique incidence method using triangular prisms instead of optical flats 15, 25 may be adopted, when a wafer to be measured has relatively rough surfaces. In this case, optical measuring systems 30, 40, as shown in FIG. 2 are provided at positions facing to both surfaces of a wafer 1. Each light beam emitted from a light source 31, 41 is expanded to a predetermined diameter by a convex lens 32, 42 or the like, collimated by a collimator lens 33, 43 and transmitted through the triangular prism 34, 44. Triangular prisms 34, 44 have referential planes facing to both surfaces of the wafer 1.

The light beams are partially transmitted through the triangular prisms 34, 44 and reflected on both surfaces of the wafer 1, while the remainders are reflected on the reference planes of the triangular prisms 34, 44. The paths of the light beams reflected on both surfaces of the wafer 1 are different in distance from the paths of the light beams reflected on the referential planes of the triangular prisms 34, 44. The differential distances correspond to profiles of both surfaces of the wafer 1. Consequently, the same interference fringes as in the case shown in FIG. 1 occur in response to the differential distances.

The measuring lights are projected on screens 35, 45 to produce images of the interference fringes. The images are converted into video signals by TV cameras 37, 47, optionally through lenses 36, 46, and inputted to computers 38, 48. The computers 38, 48 analyze the video signals to calculate profiles of both surfaces of the wafer 1 and also a real shape of the wafer 1 in consultation with thickness values actually measured by the sensors 51, 52, 53. The calculation results are recorded in the computers 38, 48 and displayed on monitors 39, 49 as occasion demands.

When a thickness variation of a wafer 1 is calculated in this way from profile data corresponding to both surfaces of the wafer 1 in consultation with thickness values measured by the thickness gauge 50, measurement results are obtained in a very short time period compared with a conventional method using displacement sensors to measure a thickness of a wafer at numerous points. Undulation and inclination of the wafer 1, which are not accompanied with a thickness variation, are also detected, since a real shape of the wafer 1 is grasped.

Incorporation of actually measured thickness values in the processing of profile data from optical measuring systems 10, 20 enables deletion of an error caused by poor parallelism and assures accurate measurement results with high reliability, even if light paths through optical flats 15, 25 or the referential planes of the triangular prisms 34, 44 are a little bit deviated from each other. Therefore, measuring results are obtained without affection of miss-setting of the optical measuring systems 10, 20, 30, 40 or miss-loading of the wafer 1, and measuring operation itself is performed with ease.

Measurement is completed in a short time period according to the new proposal even in the case of a large-size wafer. For instance, a time of 60 seconds or shorter is enough to inspect one wafer of 300 mm in diameter, including loading/unloading, alignment and input of image data. Throughput is estimated more than 60 wafers/hour by combination of one measuring apparatus with a plurality of computers for image-analysis.

Since a wafer 1 is vertically supported at its edge during measuring, measurement results are free from affection of deformation of the wafer 1, which would occur due to gravity when the wafer is horizontally held. The vertical supporting also effectively protects the wafer 1 from flaws. In addition, an edge of the wafer 1 is apparently distinguished by observation of interference fringes, so that substantially a whole surface of the wafer 1 can be subjected to measurement without any unmeasurable area near the periphery as in a conventional method using displacement sensors. Furthermore, adhesion of particles suspended in the air to the wafer is diminished, since the wafer is supported in a static state during measuring. Merely a little external force is required for supporting the wafer 1 during measurement, so that an error caused by physical deformation of the wafer 1 is not incorporated in measuring results.

As an example of the present invention, a single crystal silicon wafer of 725 μm in average thickness was sliced off an ingot of 200 mm in diameter. After both surfaces of the wafer 1 was polished, the wafer 1 was offered for profile measurement using optical measuring systems 10, 20, as shown in FIG. 1.

Three pairs of non-contacting laser displacement sensors were used as thickness-measuring sensors 51, 52, 53, to detect thickness values at three measuring points $A_1, A_2, A_3$, which were predetermined at positions apart from each other in the same intervals along the measuring circle R (shown in FIG. 6) of 180 mm in diameter. The thickness values were 725.4 μm at the point $A_1$, 725.1 μm at $A_2$ and 725.5 μm at $A_3$, respectively.

Profiles of main and backside surfaces of the wafer 1 were calculated from interference fringes produced by the optical measuring systems 20, 10 and synthesized in consultation with thickness values measured by the sensors 51, 52, 53 to produce a real shape of the wafer 1. The results are shown in FIG. 9, in which the profiles of the backside surface (the lower part) and the main surface (the upper part) of the wafer 1 were illustrated in a 3-D map consisting of square elements with every 1 mm pitch. A flatness of the wafer 1 was calculated as an distance between maximum and minimum thickness values among the thickness data. The flatness obtained in this way was 0.78 μm.

For comparison, the same wafer 1 was subjected to conventional measurement using capacitance-type displacement sensors. A flatness value obtained in this case was 0.59 μm, a little bit smaller than the former value. Such the smaller value was caused by a poor resolving power of the displacement sensors along a lateral direction of the wafer and affection of an unmeasurable zone of the wafer at its periphery. That is, when a capacitance-type displacement sensor is used for measurement, deviation of a height of the sensor from a surface of an object is represented by fluctuation of capacitance. A thickness value at each measuring point is obtained as a mean value within an area of more than 10 $mm^2$, since the measuring point needs an area of at least 10 $mm^2$.

On the other hand, when, for example, a charge-coupled device having 256×256 pixels is used for analyzing interference fringes of a wafer of 200 mm in diameter, a resolving power per one pixel is approximately 0.8 mm×0.8 mm=0.64 $mm^2$. This resolving power is ten times or much finer compared with that of a capacitance-type displacement sensor. Use of interference fringes remarkably improves resolution, and minute undulations on the main and backside surfaces of the wafer 1 are also detected. Furthermore, a real shape of the wafer 1 can be accurately grasped even at its circumferential zone where the thickness tends to decrease, by calculation of profile data in consultation with actually measured thickness values. Measurement results based on the real shape are superior of accuracy with high reliability.

A time required for measuring the profiles of the main and backside surfaces and the thickness variation was 40 second per wafer, including loading/unloading, alignment of the wafer and input of the image. On the contrary, when the conventional displacement sensor was used, the profiles of the main and backside surfaces were unmeasurable, and it took 1.5 minutes to detect the thickness variation of the same sized wafer. Besides, the thickness variation obtained in this case lacked reliability, compared with the value according to the present invention.

According to the present invention as aforementioned, interference fringes corresponding to both surfaces of a wafer are used for detecting profiles of main and backside surfaces of the wafer, and a real shape of the wafer is calculated from the profile data in consultaion with actually measured thickness values which enables deletion of an error caused by mis-setting of optical measuring systems or miss-loading of the wafer. Consequently, a precise thickness variation with high reliability is obtained from the real shape in a very short time, and the measurement itself is performed with ease. The profiles of the main and backside surfaces, a thickness variation and a real thickness are also obtained from the real shape. Measurement is performed without deformation of the wafer, since the wafer is vertically supported in a static state free from affection of gravity. The vertical supporting is also effective for protection of the wafer from generation of flaws and adhesion of particles, so that the wafer keeps its original properties without deterioration after measurement.

What is claimed is:

1. An optical apparatus for measuring profiles of a wafer having a pair of optical measuring systems located at positions facing to both surfaces of a wafer vertically supported at its edge and a thickness gauge with one or more sensors, each of said optical measuring systems comprising:

a light emitter for discharging a measuring light beam;

a collimator lens for rectifying said measuring light beam into a collimated beam;

an optical flat for transmitting the collimated measuring beam;

a light detector for receiving two measuring beams, one of which is reflected on a surface of said wafer and returned through said optical flat and said collimator lens, the other of which is reflected on a referential plane of said optical flat and returned through said collimator lens; and a computer for processing interference fringes which occurs between said two light beams, whereby profiles of main and backside surfaces of said wafer are calculated from said interference fringes corresponding to both surfaces of said wafer; and a real shape of said wafer is determined from said profiles of main and backside surfaces of said wafer in consultation with thickness values measured by said thickness gauge at a plurality of points of the wafer.

2. An optical apparatus for measuring profiles of a wafer having a pair of optical measuring systems provided at positions facing both surfaces of a wafer vertically supported at its edge and a thickness gauge with one or more sensors, each of said optical measuring systems comprising:

a light emitter for discharging a measuring light beam;

a collimator lens for rectifying said measuring light beam into a collimated beam;

a triangular prism for transmitting the collimated measuring beam;

a light detector for receiving two measuring beams, one of which is reflected on a surface of said wafer and returned through said triangular prism and said collimator lens, the other of which is reflected on a referential plane of said triangular prism and returned through said collimator lens; and a computer for processing interference fringes which occur between said two light beams, whereby profiles of main and backside surfaces of said wafer are calculated from said interference fringes corresponding to both surfaces of said wafer; and a real shape of said wafer is determined from said profiles of main and backside surfaces of said wafer in consultation with thickness values measured by said thickness gauge at plurality of points of the wafer.

* * * * *

UNITED STATES PATENT AND TRADEMARK OFFICE
CERTIFICATE OF CORRECTION

PATENT NO.      : 6,504,615 B1
DATED           : January 7, 2003
INVENTOR(S)     : Kohzo Abe It is certified that error appears in the above-identified patent and that said Letters Patent is hereby corrected as shown below:

Column 2,
Line 37, "and S both" should read -- and both --.

Column 5,
Line 26, "smaller by 5r" should read -- smaller by $\delta r$ --.
Line 30, "support .54, while" should read -- support 54, while -- (delete period).
Line 67, "is called as" should read -- is called -- (delete 'as').

Column 6,
Line 19, "plane Hi" should read -- plane $H_1$ --.

Signed and Sealed this

Sixth Day of May, 2003

JAMES E. ROGAN
*Director of the United States Patent and Trademark Office*